(12) United States Patent
Kudelka et al.

(10) Patent No.: US 7,413,951 B2
(45) Date of Patent: Aug. 19, 2008

(54) STACKED CAPACITOR AND METHOD FOR PRODUCING STACKED CAPACITORS FOR DYNAMIC MEMORY CELLS

(75) Inventors: Stephan Kudelka, Dresden (DE); Peter Moll, Dresden (DE); Stefan Jakschik, Kessel-Lo (BE); Odo Wunnicke, Dresden (DE)

(73) Assignee: Qimonda AG, Munich (DE)

( * ) Notice: Subject to any disclaimer, the term of this patent is extended or adjusted under 35 U.S.C. 154(b) by 41 days.

(21) Appl. No.: 11/518,504

(22) Filed: Sep. 7, 2006

(65) Prior Publication Data
US 2007/0059893 A1      Mar. 15, 2007

(30) Foreign Application Priority Data
Sep. 7, 2005    (DE) .................. 10 2005 042 524

(51) Int. Cl.
*H01L 21/8242* (2006.01)
(52) U.S. Cl. .................. 438/253; 438/254; 257/308; 257/E27.089
(58) Field of Classification Search .......... 438/253, 438/254; 257/305, 308, E27.089
See application file for complete search history.

(56) References Cited

U.S. PATENT DOCUMENTS

| | | | |
|---|---|---|---|
| 5,330,614 | A | 7/1994 | Ahn |
| 5,716,884 | A | 2/1998 | Hsue et al. |
| 5,753,949 | A | 5/1998 | Honma et al. |
| 5,824,592 | A | 10/1998 | Tseng |
| 5,946,571 | A | 8/1999 | Hsue et al. |
| 6,008,514 | A | 12/1999 | Wu |
| 6,025,246 | A | 2/2000 | Kim |
| 6,156,608 | A | 12/2000 | Chen |
| 6,303,956 | B1 * | 10/2001 | Sandhu et al. .............. 257/306 |
| 6,395,600 | B1 | 5/2002 | Durcan et al. |
| 6,403,418 | B2 | 6/2002 | Wang et al. |
| 6,403,442 | B1 | 6/2002 | Reinberg |

(Continued)

FOREIGN PATENT DOCUMENTS

DE    10 2004 045 492 A1    5/2005

(Continued)

OTHER PUBLICATIONS

Kaga, T., et al., "Crown-Shaped Stacked-Capacitor Cell for 1.5-V Operation 64-Mb DRAMs," IEEE Transactions on Electron Devices, vol. 38, No. 2, Feb. 1991, pp. 255-261, IEEE.

(Continued)

*Primary Examiner*—Trung Dang
(74) *Attorney, Agent, or Firm*—Slater & Matsil, L.L.P.

(57) ABSTRACT

A method produces stacked capacitors for dynamic memory cells, in which a number of trenches (48) are formed in the masking layer (40), each trench (48) being arranged above a respective contact plug (26) and extending from the top (42) of the masking layer (40) to the contact plugs (26). A conductive layer (50) covers the side walls (49) of the trenches (48) and the contact plugs (26) in order to form a first electrode (60) of a stacked capacitor (12). In an upper region (63), which is remote from the contact stack (26), the conductive layer (50) is replaced by an insulating layer, so that it is not possible for a short circuit to arise in the event of any adhesion between adjacent electrodes.

27 Claims, 11 Drawing Sheets

U.S. PATENT DOCUMENTS

| | | | |
|---|---|---|---|
| 6,489,195 B1 | 12/2002 | Hwang et al. | |
| 6,548,853 B1 | 4/2003 | Hwang et al. | |
| 6,563,190 B1 | 5/2003 | Lee et al. | |
| 6,617,222 B1 | 9/2003 | Coursey | |
| 6,620,686 B2 | 9/2003 | Kim et al. | |
| 6,646,299 B2 | 11/2003 | Willer et al. | |
| 6,667,502 B1 | 12/2003 | Agarwal et al. | |
| 6,667,505 B2 | 12/2003 | Narimatsu et al. | |
| 6,794,245 B2 * | 9/2004 | Zheng | 438/255 |
| 6,838,338 B2 * | 1/2005 | Sandhu et al. | 438/253 |
| 7,053,435 B2 | 5/2006 | Yeo et al. | |
| 7,067,385 B2 | 6/2006 | Manning | |
| 7,112,487 B2 | 9/2006 | Gutsche et al. | |
| 2002/0094617 A1 | 7/2002 | Taniguchi | |
| 2002/0149043 A1 | 10/2002 | Willer et al. | |
| 2003/0001180 A1 | 1/2003 | Narimatsu et al. | |
| 2003/0143801 A1 * | 7/2003 | Basceri et al. | 438/240 |
| 2003/0227044 A1 | 12/2003 | Park | |
| 2005/0048717 A1 | 3/2005 | Ito et al. | |
| 2005/0054159 A1 | 3/2005 | Manning et al. | |
| 2005/0245022 A1 | 11/2005 | Gutsche et al. | |
| 2005/0245027 A1 | 11/2005 | Gutsche et al. | |
| 2006/0237762 A1 | 10/2006 | Park | |

FOREIGN PATENT DOCUMENTS

| | | |
|---|---|---|
| DE | 10 2004 055 463 A1 | 8/2005 |
| JP | 2005 150747 | 6/2005 |

OTHER PUBLICATIONS

Drynan, J.M., et al., "Cylindrical Full Metal Capacitor Technology for High-Speed Gigabit DRAMs," 1997 Symposium on VLSI Technology Digest of Technical Papers, Jun. 10-12, 1997, pp. 151-152, IEEE.

Hatakeyama, A., et al., "A 256-Mb SDRAM Using a Register-Controlled Digital DLL," IEEE Journal of Solid-State Circuits, vol. 32, No. 11, Nov. 1997, pp. 1728-1734, IEEE.

* cited by examiner

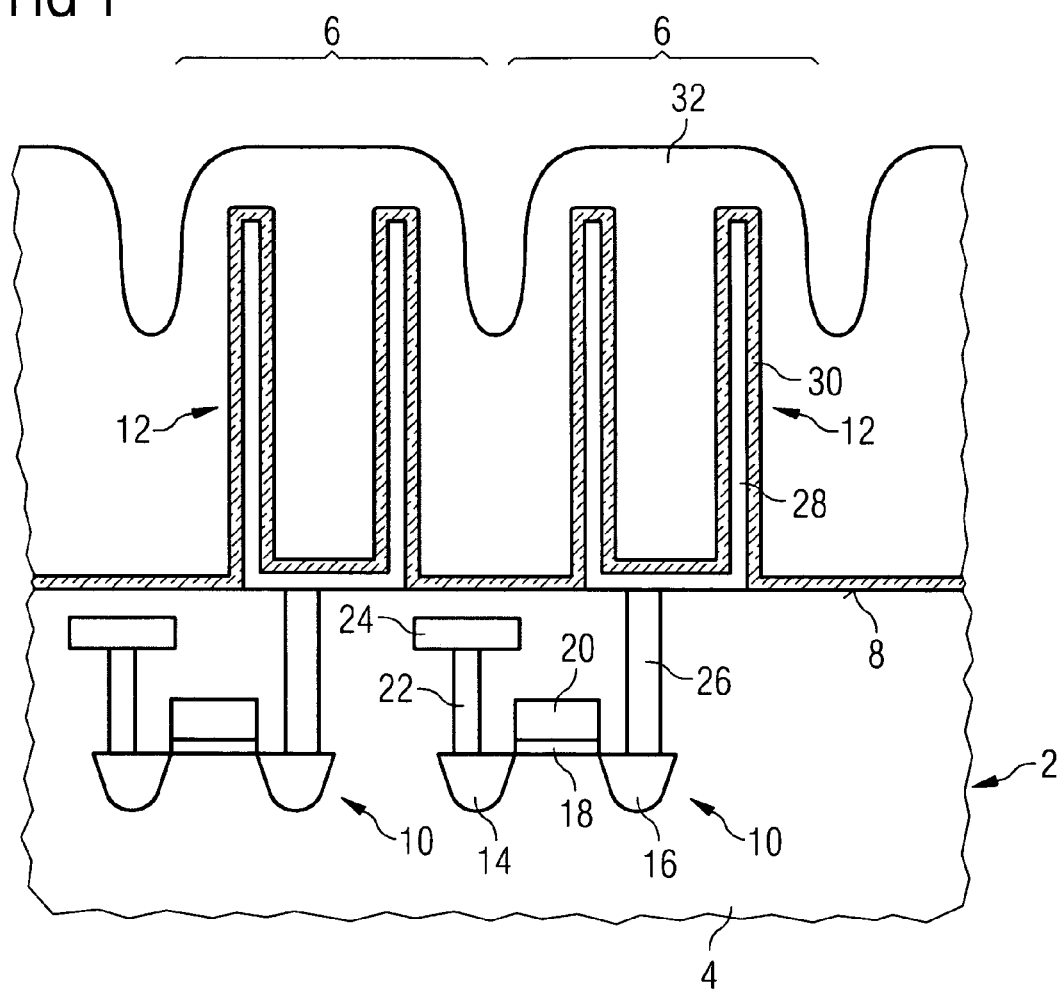

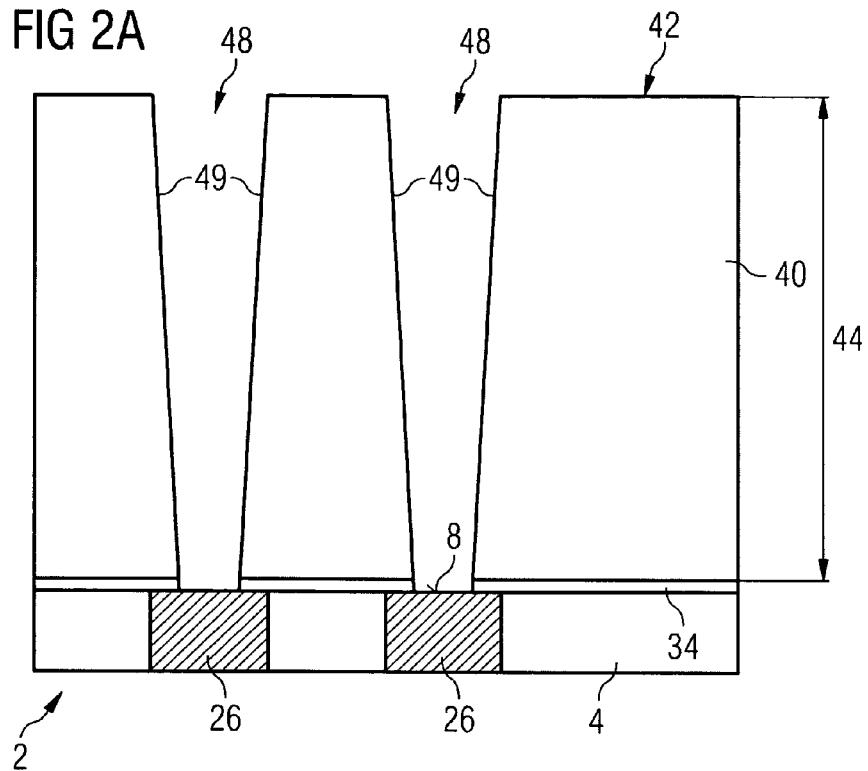
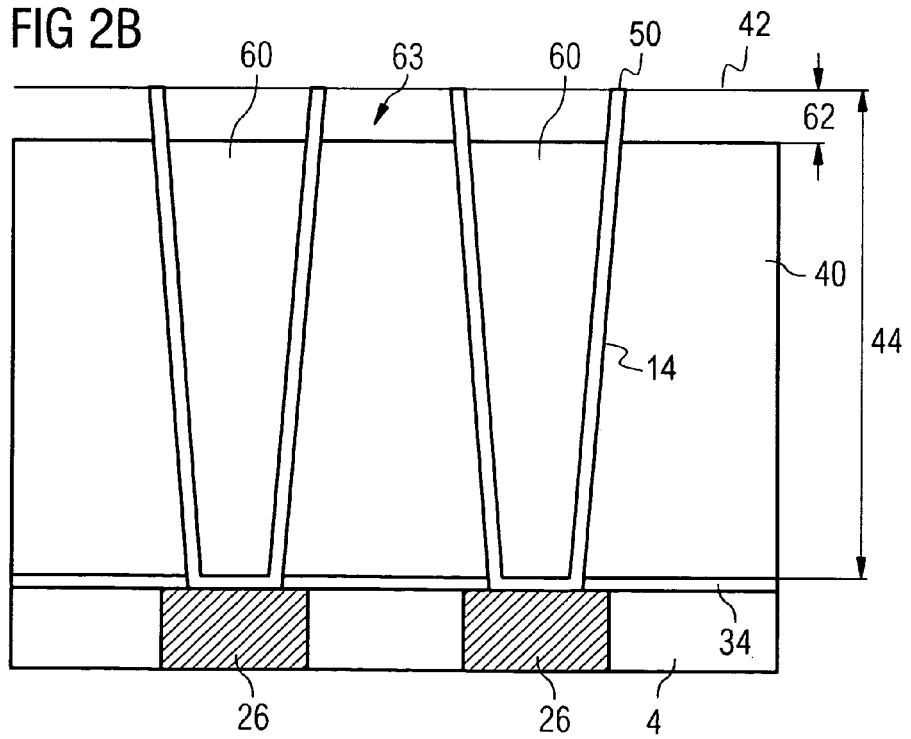

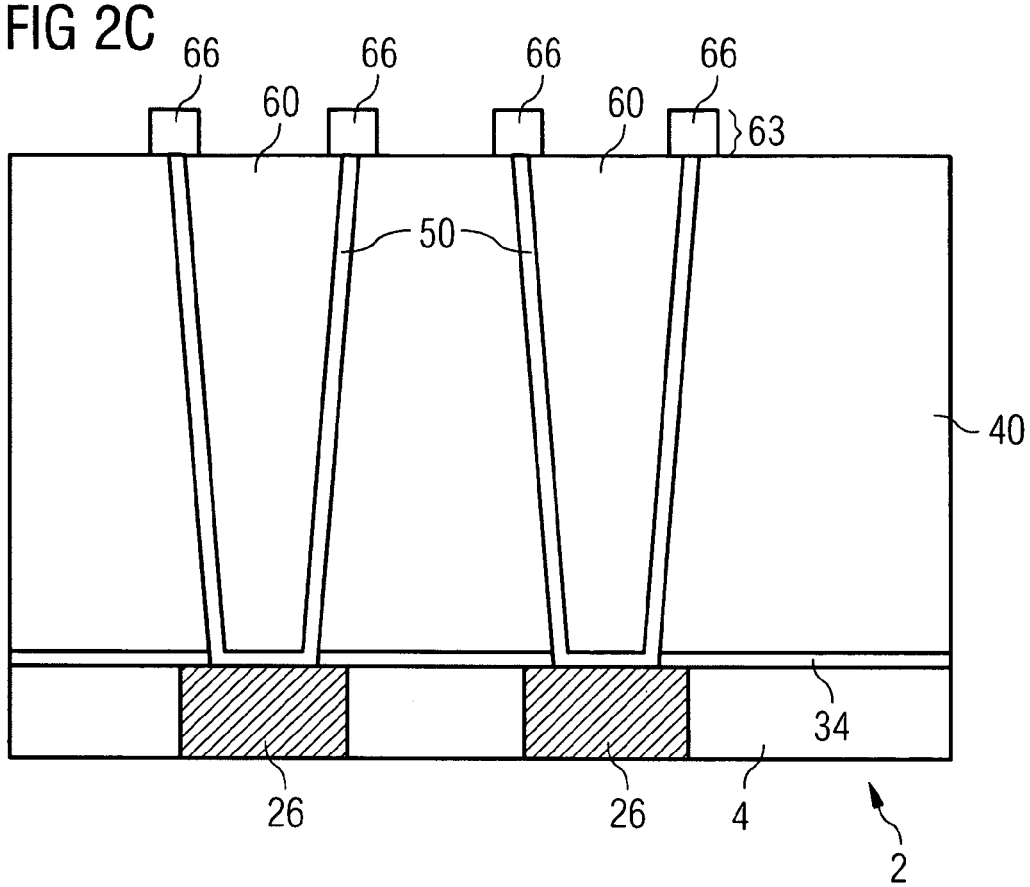
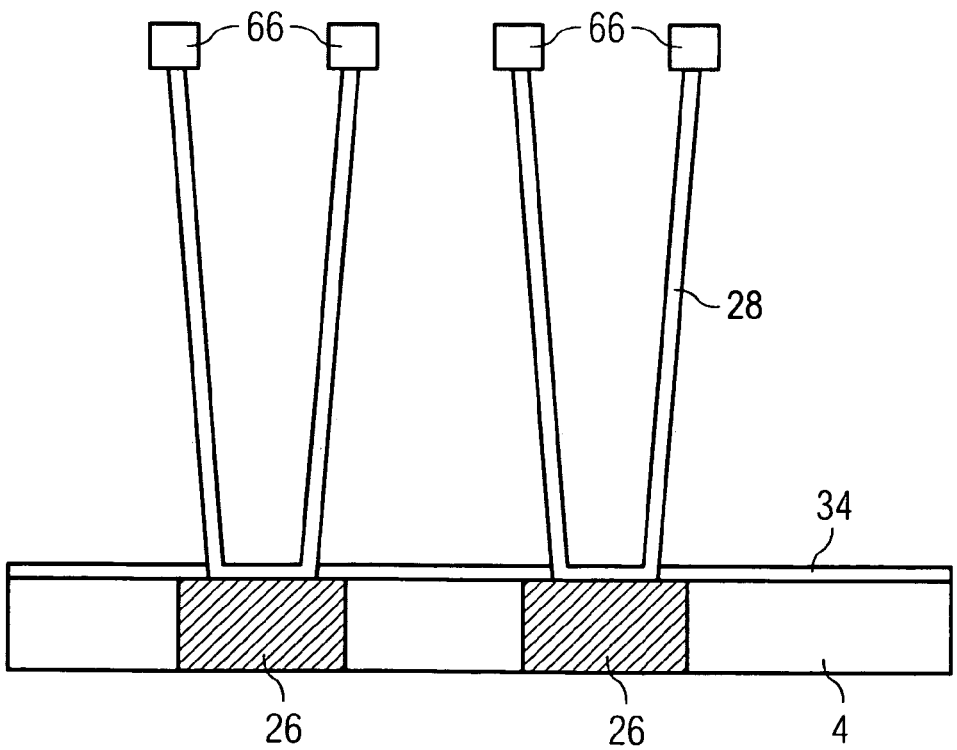

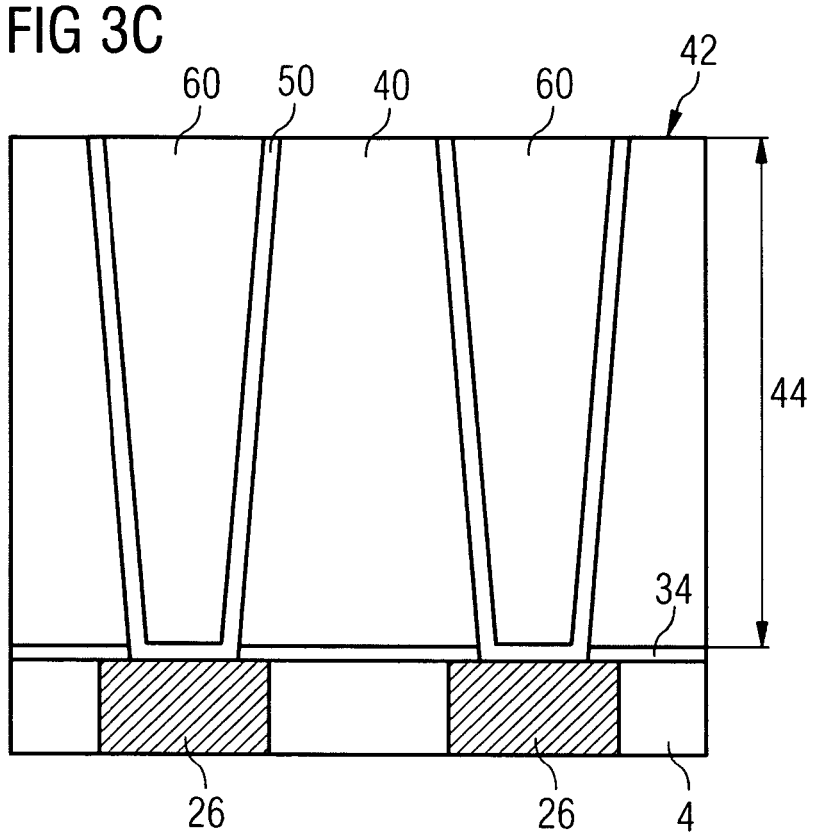
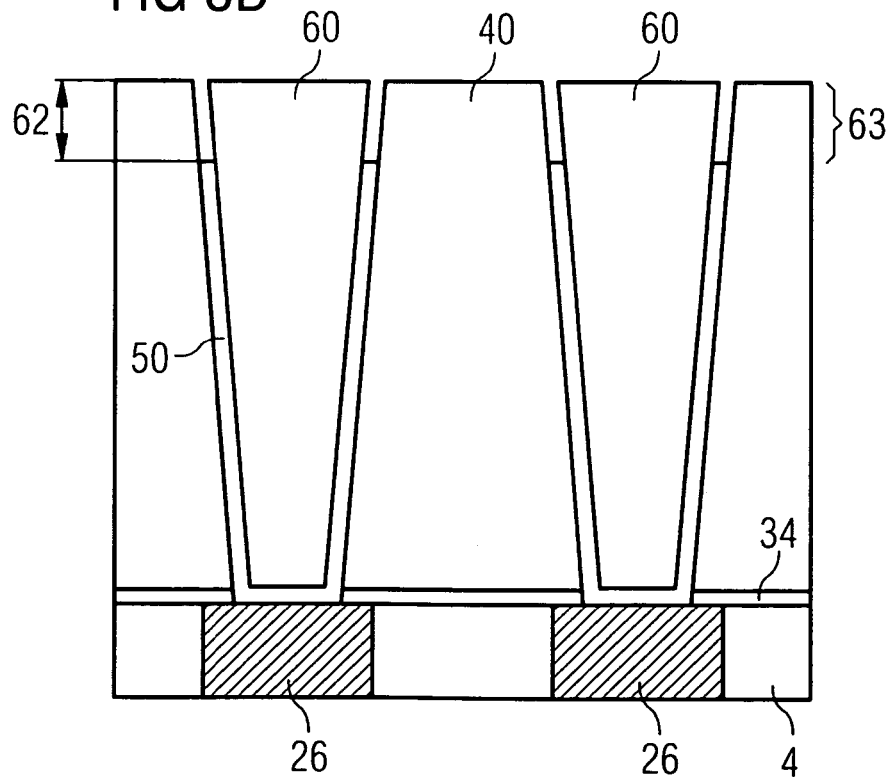

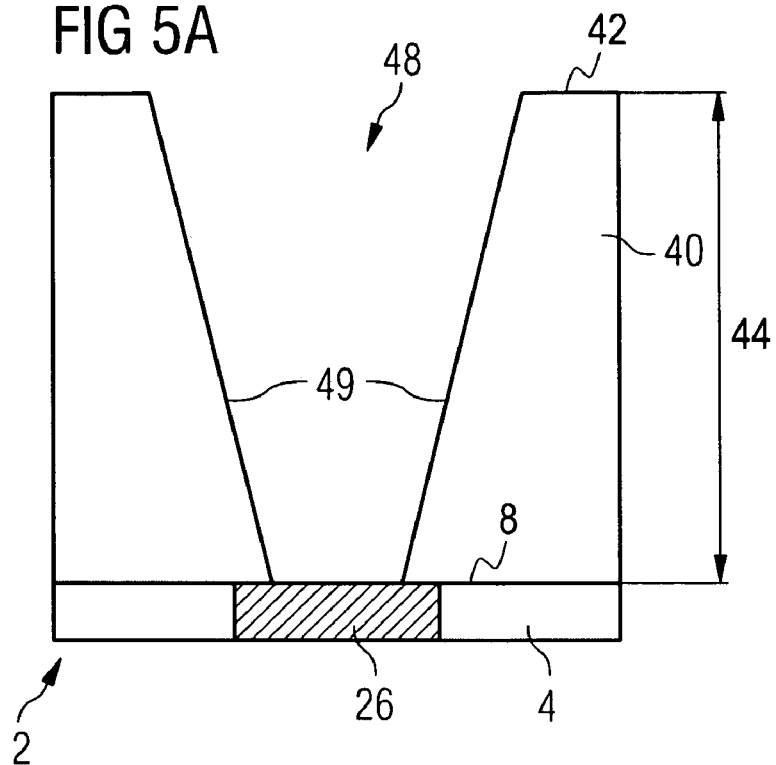
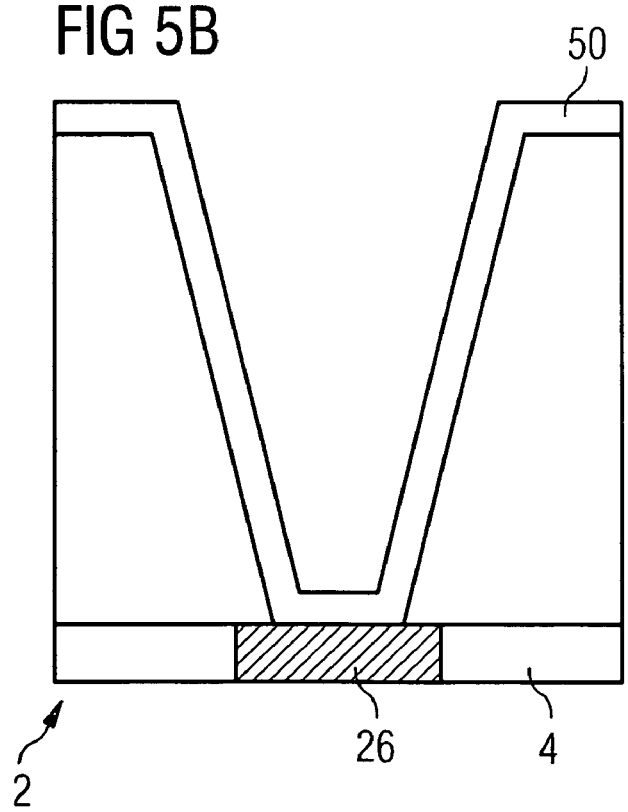

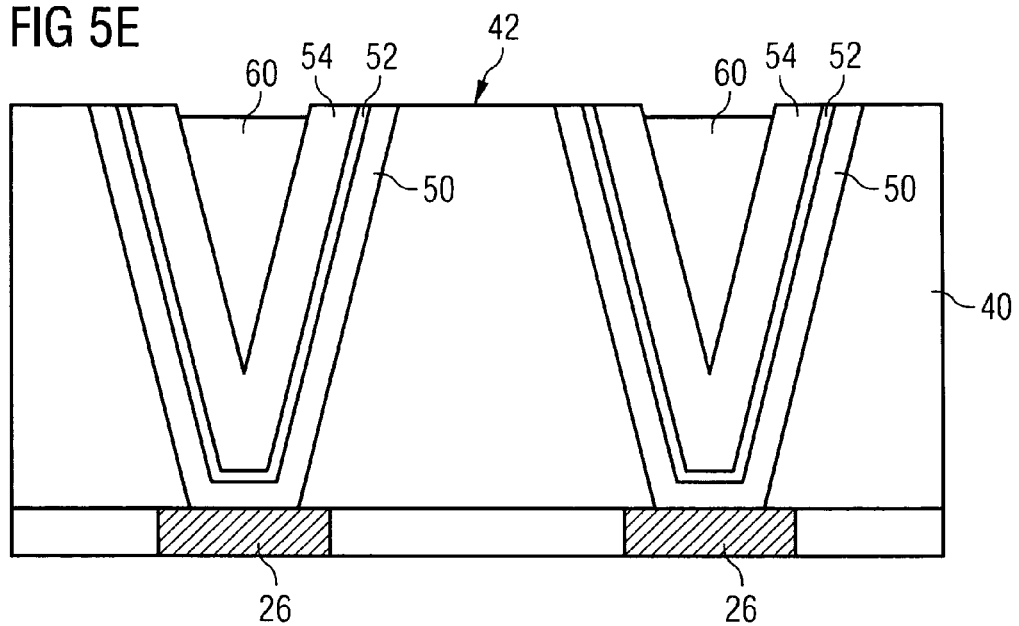
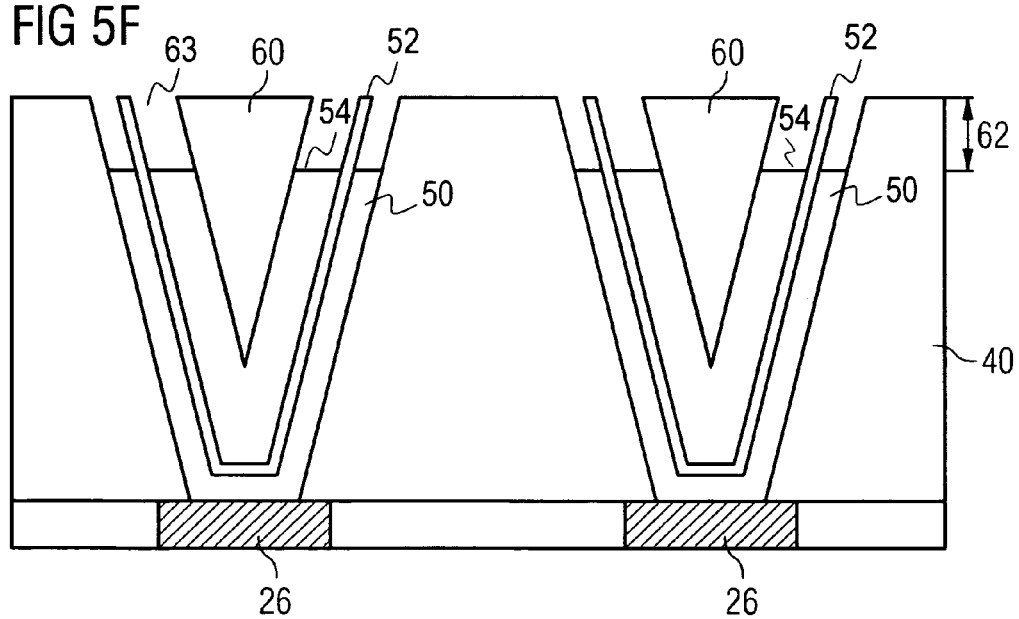

STACKED CAPACITOR AND METHOD FOR PRODUCING STACKED CAPACITORS FOR DYNAMIC MEMORY CELLS

This application claims priority to German Patent Application 10 2005 042 524.0 which was filed Sep. 7, 2005 and is incorporated herein by reference.

TECHNICAL FIELD

The invention relates to a stacked capacitor for dynamic memory cells. The invention also relates to methods for producing stacked capacitors for dynamic memory cells.

BACKGROUND

When producing integrated circuits, attempts are made at continuously reducing the structure sizes of the components produced. For particular circuit elements, such as capacitors, reducing the structure dimensions influences the electrical properties. To guarantee a minimum value for the capacitance of a storage capacitor which should be exceeded, for example, a particular surface area of the capacitor must therefore be above a prescribed value. This is particularly important for dynamic random access memories (DRAMs), for which a large scale of integration is pursued.

When the surface area on a semiconductor wafer's top that is allocated to a single memory cell is reduced, the capacitance of the storage capacitor likewise decreases. For reliable storage by the memory cell, a particular storage capacity must not be undershot. This value is usually in the region of 30 fF. If the capacitance of the storage capacitor is too small, the charge that is stored on the storage capacitor is too small to produce a reliably detectable signal. In this case, the information stored in the memory cell is subject to large disturbances or is even lost and the memory cell does not work in the desired manner.

In the past, several concepts have been developed to allow provision of a sufficiently large storage capacity as structure dimensions decrease. In this context, the storage capacitors in memory cells are designed in a three-dimensional arrangement.

In a first example, the storage capacitors are arranged within a deep trench in the substrate of a semiconductor wafer. This results in a large surface area for the capacitor, which has a high capacitance value, with just a small surface area being used on the top of the substrate. The selection transistor associated with the storage capacitor is usually formed as a planar transistor on the top of the substrate.

In another example, what are known as stacked capacitors are formed, which are arranged over the top of the substrate. The selection transistors are formed below the stacked capacitor. The stacked capacitor includes a first electrode and a second electrode that have a dielectric layer fitted between them. The first electrode is usually formed as a cylindrical structure on the surface of the substrate. When the stacked capacitor is produced, the starting point is usually a masking layer that is fitted above the selection transistors and is patterned with depressions. The depressions are lined with a conductive layer. The first electrodes are then provided as exposed structure elements by removing the masking layer added by way of assistance.

The masking layer is usually removed in an etching step. The exposed electrodes are then cleaned in order to put on the dielectric layer and the second electrode. Etching and cleaning processes are usually performed in a liquid-based process.

As structure sizes decrease, the wet etching and cleaning process steps described above become increasingly difficult, however. Conventional wet etching processes or cleaning processes, which use high-purity deionized water, for example, result in what are known as capillary forces between adjacent structures. As structure sizes decrease, it becomes evermore probable that adjacent structure elements will adhere to one another during etching or cleaning. Adhesion between adjacent structures is triggered by the cleaning or etching liquids, with particularly the capillary forces of the liquids used bending the structure elements.

In subsequent drying steps, it is possible that the electrode structures will remain connected to one another on account of the static friction if the static friction forces are larger than the bending stresses in the deformed electrode structures. This phenomenon is usually called "stiction" in English. Particularly critical in this context are process steps in which the semiconductor wafers provided with the electrode structures are swapped between wet and dry processes. One example that may be mentioned here is the swapping of semiconductor wafers between different process modules for etching, cleaning and drying, where the semiconductor wafers are exposed to an air/water interface. As the structure dimensions of stacked capacitors are reduced further, it is, therefore, necessary for the process management to avoid adhesion between adjacent structures as far as possible. One option might be to dispense completely with liquid-based process steps. By way of example, the etching steps could be carried out in the vapor phase, for example, by using an etching gas based on hydrogen fluoride. However, it should be remembered in this context that full process management in the vapor phase can often result in unwanted residues on the surface of the etched structures. This adversely affects particularly the further process steps, that is to say putting on the dielectric layer and forming the second electrodes.

Another option is for the structures of the first capacitor electrodes to be mechanically supported by other, in particular nonconductive, structures, so that the capillary forces cannot result in the capacitor electrodes sticking together. However, this procedure has the drawbacks that the structures to be produced are more complicated and that further reduction of the structure dimensions is made additionally more difficult.

There is, therefore, a need in the art for a method and for stacked capacitors that overcome the aforementioned problems.

SUMMARY OF THE INVENTION

In a first aspect, stacked capacitors are produced for dynamic memory cells. A semiconductor wafer having a substrate is provided. A plurality of contact plugs are formed on the surface of the substrate. A masking layer is deposited on the surface of the substrate and on the contact plugs. A plurality of trenches are formed in the masking layer, each of the trenches being arranged above a respective contact plug, and each trench extending from the top of the masking layer to the contact plugs. A conductive layer is put on the front of the semiconductor wafer. The conductive layer covers the side walls of the trenches and the contact plugs in order to form a first electrode of the stacked capacitor. A filling material is put on the front of the semiconductor wafer, so that the trenches are filled with the filling material up to the top of the masking layer. The conductive layer of the first electrode is replaced by an insulating layer in an upper region that is remote from the contact stack. The masking layer and the filling material are removed in order to form exposed first electrodes. A dielectric layer covering the side faces of the exposed first electrodes is put on. A further conductive layer is deposited above the dielectric layer on the front of the semiconductor wafer in order to form second electrodes of the stacked capacitor.

A second aspect of the invention also provides a method for producing stacked capacitors for dynamic memory cells. A semiconductor wafer having a substrate is provided. A plurality of contact plugs are formed on the front of the substrate. A masking layer is deposited on the front of the substrate and on the contact plugs. A plurality of trenches are formed in the masking layer. Each of the trenches is arranged above a respective contact plug, and each trench extends from the top of the masking layer to the contact plugs. A conductive layer is put on the front of the semiconductor wafer. The conductive layer covers the side walls of the trenches and the contact plugs in order to form a first electrode of the stacked capacitor. A filling material is put on the front of the semiconductor wafer, so that the trenches are filled with the filling material up to the top of the masking layer. The conductive layer of the first electrode is replaced by an insulating layer in an upper region that is remote from the contact stack. This can be accomplished by removing the conductive layer in the upper region that is remote from the contact stack in order to form cutouts. The insulating layer is put on in the upper region, thus filling the cutouts. The parts of the insulating layer that are situated on the filling material and on the masking layer are removed. The masking layer and the filling material are removed in order to form exposed first electrodes. A dielectric layer covering the side faces of the exposed first electrodes is put on. A further conductive layer is deposited above the dielectric layer on the front of the semiconductor wafer in order to form second electrodes of the stacked capacitor.

Another aspect of this invention provides another method for producing stacked capacitors for dynamic memory cells. A semiconductor wafer having a substrate is provided. A plurality of contact plugs are formed on the front of the substrate. A masking layer is deposited on the front of the substrate and on the contact plugs. A plurality of trenches are formed in the masking layer. Each of the trenches is arranged above a respective contact plug, and each trench extends from the top of the masking layer to the contact plugs. A first conductive layer is put on the front of the semiconductor wafer. A dielectric layer is put on the first conductive layer. A second conductive layer is put on the first dielectric layer. The first conductive layer, the dielectric layer and the second conductive layer are removed from the top of the masking layer. A filling material is put on the front of the semiconductor wafer, so that the trenches are filled with the filling material up to the top of the masking layer. The first conductive layer and the second conductive layer are removed in the upper region, which is remote from the contact stack in order to form cutouts. An insulating layer is put on in the upper region, thus filling the cutouts. The filling material is removed and a further dielectric layer covering the outer faces of the first conductive layer is put on. A further conductive layer is deposited on the front of the semiconductor wafer in order to form second electrodes of the stacked capacitor.

Embodiments of the invention also provide an inventive stacked capacitor. A contact plug is disposed on the front of a substrate. A cup-shaped first electrode of the stacked capacitor is supported on the contact plug as a conductive layer and has side walls that project from the front of the substrate. That part of the first electrode, which is remote from the substrate, has an insulating layer that adjoins the conductive layer and whose side faces continue in the direction of the side faces of the first electrode. A dielectric layer covers at least the side faces of the exposed first electrodes. A further conductive layer overlies the dielectric layer on the front of the semiconductor wafer. The further conductive layer forms a second electrode of the stacked capacitor.

Yet other embodiments of the inventive stacked capacitor include a contact plug on the front of a substrate. A cup-shaped first electrode of the stacked capacitor is supported on the contact plug as a conductive layer and has side walls that project from the front of the substrate. That part of the first electrode, which is remote from the substrate, has an insulating layer that has a greater thickness than the conductive layer and has side faces, continuing in the direction of the side faces of the first electrode, and is arranged partly over the conductive layer. A dielectric layer covers the side faces of the exposed first electrodes. A further conductive layer overlies the dielectric layer on the front of the semiconductor wafer. The further conductive layer forms a second electrode of the stacked capacitor.

In line with the invention, stacked capacitors are formed to have an insulating layer at their upper edge, so that it is not possible for a short circuit to arise in the event of any adhesion between adjacent electrodes. This allows an increase in the yield and reliability of integrated semiconductor chips.

BRIEF DESCRIPTION OF THE DRAWINGS

The invention will now be explained in more detail with reference to the appended drawing, in which:

FIG. 1 schematically shows a cross-sectional view through a semiconductor wafer with DRAM memory cells;

FIGS. 2A to 2D show one possible embodiment of an inventive method for forming the stacked capacitors, with cross-sectional views through a semiconductor wafer in various stages of the method being shown schematically in each case;

FIGS. 3A to 3F show another possible embodiment of an inventive method for forming the stacked capacitors, with cross-sectional views through a semiconductor wafer in various stages of the method being shown schematically in each case;

FIGS. 5A to 5F show another possible embodiment of an inventive method for forming the stacked capacitors, with cross-sectional views through a semiconductor wafer in various stages of the method being shown schematically in each case.

DETAILED DESCRIPTION OF ILLUSTRATIVE EMBODIMENTS

Figure 3A:
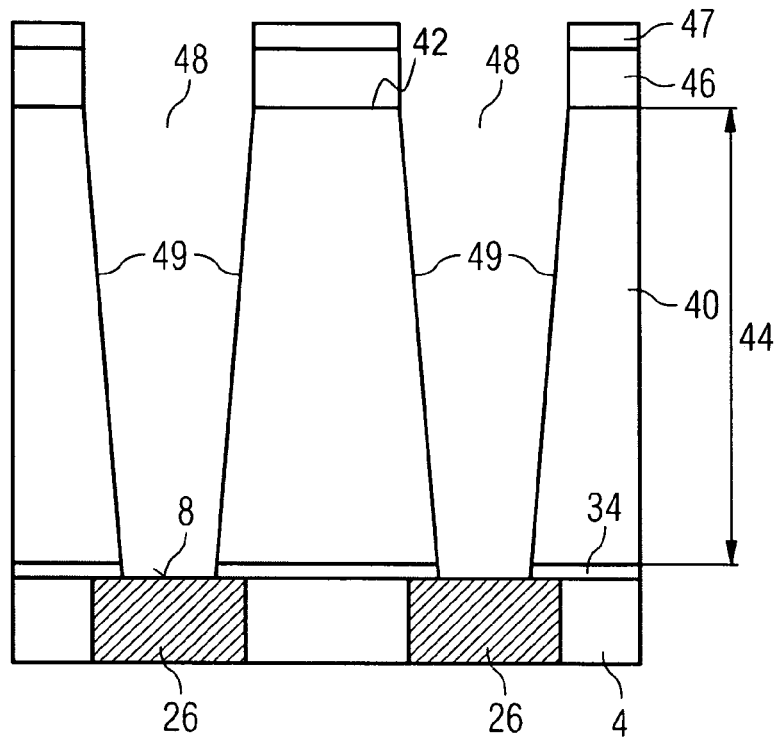

The invention is explained by way of example using a method for producing a DRAM chip. However, the invention can also be applied to other production methods in which exposed structure elements need to be formed which must not exhibit any adhesion during production. One example that may be mentioned here is surrounding gated transistors (SGT), which are produced on a columnar semiconductor.

FIG. 1 shows a side view of a stacked capacitor for a DRAM cell. A semiconductor wafer 2 comprises a substrate 4 of a semiconductive material. The semiconductive material used is silicon, for example. The semiconductor wafer 2 is the starting point for producing a multiplicity of memory cells 6. Each memory cell 6 contains a selection transistor 10 and a stacked capacitor 12. The stacked capacitor 12 is arranged above the surface 8 of the substrate 4.

The selection transistor 10 is arranged within the substrate 4. The selection transistor 10 is formed by a first connection 14 and a second connection 16. Arranged between the first connection 14 and the second connection 16 is a gate connection 20, which is fitted above a preferably thin gate dielectric 18.

By way of example, the gate connection 20 can comprise a stack of different layers, for example silicon and tungsten. The gate connection 20 is also used as a word line in order to address a particular memory cell 6 during operation of the memory cells. The multilayer design is used particularly to reduce the resistance of the gate line 20.

The first connection 14 is connected to a bit line connection 22. The bit line connection 22 is arranged above the first connection 14. The bit line connection 22 is connected to a bit line 24 which is arranged above the bit line connection 22. The bit line 24 is used as a read or write line during operation of the memory cells 6.

The second connection 16 is connected to a contact plug 26. The contact plug 26 is arranged above the second connection 16. The contact plug 26 is used as a connection to a first electrode 28 of the capacitor 12. The first electrode 28 of the capacitor 12 is arranged above the surface 8 of the substrate 4.

FIG. 1 shows the first electrodes 28 in a side view. The three-dimensional structure of the first electrodes may have different geometries. It is thus possible for the first electrodes 28 to have a cylindrical, elliptical or rectangular geometry.

As FIG. 1 shows, an almost vertical side wall above the contact plug 26 is used for the first electrodes. However, it is also possible to use nonvertical side walls or side walls that have a refined structure.

The first electrode 28 of the capacitor 12 is covered by a dielectric layer 30. The dielectric layer 30 is used as a dielectric for the capacitor 12. A second electrode 32 is arranged above the dielectric layer 30. Normally, the second electrode 32 of the capacitor 12 is a common electrode for all memory cells 6 in the memory chip. The second electrode 32 is, therefore, a connection between adjacent memory cells 6.

However, a knowledgeable person skilled in the art knows that other elements are necessary or desirable in order to form a working memory cell 6. By way of example, it would be possible to fit insulation between adjacent transistors 10 in order to prevent short circuits between adjacent connections. In addition, a barrier layer is usually put on between the contact plug 26 and the first electrode 28 in order to prevent diffusion by the various materials. It is likewise conceivable to produce insulation between various contact plugs 26 in order to prevent a short circuit to adjacent memory cells 6. In another refinement, it is likewise conceivable to arrange the bit line 24 above the second electrode 32 of the capacitor 12 by using an extended bit line contact 22.

With reference to FIGS. 2A to 2D, the text below describes an embodiment of a method for producing storage capacitors, which is suitable for producing DRAM memory cells, as are shown in FIG. 1.

In a first process step, the method based on a first embodiment of the invention provides the semiconductor wafer 2, which is used to produce the memory cells 6 with the stacked capacitors. The semiconductor wafer 2 comprises the substrate 4. In previous process steps, the transistors 10, bit lines 24 and other elements of the memory cell 6 are produced in the substrate 4. As FIG. 2A shows, the surface 8 of the substrate 4 has had an insulation layer 34 put on it, which leaves free the top of the contact plugs 26. The insulation layer 34 may comprise silicon nitride or silicon dioxide, for example. The contact plugs 26 preferably have a low resistance and are produced from amorphous silicon doped with arsenic, for example. In a production technology that has a minimum structure dimension of 70 nm, the contact plugs 26 are at a distance from one another, which is in the order of magnitude between 50 nm and 200 nm.

In another step, a masking layer 40 is deposited on the surface 8 of the substrate 4, on the insulation layer 34 and on the contact plugs 26. The masking layer 40 is provided by means of full-area deposition of a polycrystalline silicon layer or of a silicon/germanium layer, for example.

The masking layer 40 is later used as an auxiliary layer for producing the first electrode 28 and must, therefore, have a certain thickness 44, since the masking layer 40 directly influences the value of the capacitance of the storage capacitor 12 in the memory cell 6 directly. For the 70 nm process line, a thickness 44 of approximately 2 µm is provided, with other values between 1 µm and 10 µm likewise being possible.

In the next step, a respective trench 48 is formed in the masking layer 40 for all memory cells 6. Each of the trenches 48 is arranged above the associated contact plug 26 and extends from the top 42 of the masking layer 40 to the contact plugs 26 on the top 8 of the semiconductor wafer 2. Each of the trenches 48 has side walls 49, which may be perpendicular or slightly inclined, for example, as shown in FIG. 2A. The trenches 48 may be formed using a dry etching process, for example.

Referring now to FIG. 2B, in conjunction with FIG. 2A, a conductive layer 50 is formed over the semiconductor wafer 2 in a subsequent process step. The conductive layer 50 covers the side walls 49 of the trenches 48 and the contact plugs 26. The conductive layer 50 later forms the first electrode 28 of the stacked capacitor 12 (as shown in FIG. 1).

By way of example, the conductive layer 50 is deposited by conformal deposition of the conductive layer 50, for example of a metal layer, on the top 42 of the masking layer 40.

In a subsequent process step, a filling material 60 is formed over the semiconductor wafer 2, for example, by means of full-area deposition and subsequent chemical-mechanical polishing (CMP) of the top 42 of the masking layer 40. After these process steps, the trenches 48 are filled with the filling material 60 up to the top 42 of the masking layer 40.

The filling material 60 is formed by depositing a further polycrystalline silicon layer, for example. This has the advantage that later the filling material 60 and the masking layer 40 can be removed in one etching step.

In an alternative embodiment, the conductive layer 50 and the filling material 60 are first deposited over the full area in succession and are then removed from the top 42 of the masking layer 40 in a single CMP step.

In a subsequent process step, the masking layer 40 and the filling material 60 are removed from the top 42 of the masking layer 40 to a depth 62. As a result, the masking layer 40 and the filling material 60 are removed in the upper region 63, which is remote from the contact plug 26, and the conductive layer 50 is exposed down to the depth 62. The masking layer 40 and the filling material 60 in the upper region 63 can be removed using a dry etching process, for example.

Next, as FIG. 2C shows, an insulating layer 66 is formed in the upper region 63 from the conductive layer 50. If a metallic layer is used for the conductive layer 50, this step is carried out by oxidizing the conductive layer 50 in the upper region 63. However, the first electrode 28 is conserved as conductive layer 50, since the first electrode 28 is protected by the filling material 60.

By way of example, the conductive layer 50 used may be a titanium or titanium nitride layer. In this context, the step of oxidizing the metal layer causes a volume expansion in the titanium oxide formed, so that the insulating layer in the upper region 63 is stretched by approximately 20% in comparison with the titanium nitride of the metal layer. The metal layer is preferably oxidized at approximately 500° C. to 600° C. As a result, the conductive layer 50 of the first electrode 28 in the upper region 63 is replaced by the insulating layer 66.

As FIG. 2D shows, the masking layer 40 and the filling material 60 are then removed in order to form the exposed first electrodes 28. The masking layer 40 and the filling material 60 are removed in one etching step, for example. Should one of the exposed first electrodes 28 fall over and hit an adjacent electrode 28 during the further processing, the insulating layer 66 would bring about insulation between adjacent electrodes 28 on account of its relatively large dimensions.

Forming a dielectric layer that covers the side faces of the exposed first electrodes 28 and depositing a further conductive layer over the dielectric layer in order to form second electrodes 32 of the stacked capacitor 12, complete the process cycle for producing a stacked capacitor, as already explained in connection with FIG. 1.

The result obtained is a stacked capacitor as shown in FIG. 2D, in which the first electrode 28 of the stacked capacitor 12 (FIG. 1) is supported on the contact plug 26 and is formed from the conductive layer 50. The first electrode has side walls that project from the top surface 8 of the substrate 4. That part of the first electrode that is remote from the substrate has an insulating layer that adjoins the conductive layer, that is to say, without covering it, continues in the direction of the side faces of the first electrode 28, so that the insulating layer adjoins the conductive layer directly and its side faces are arranged essentially parallel to, but, on account of the relatively large thickness of the insulating layer, with a lateral offset from, the side faces of the conductive layer.

The text below describes another embodiment with reference to FIGS. 3A to 3F, with DRAM memory cells as shown in FIG. 1 again being produced.

In turn, the method based on the second embodiment of the invention provides the semiconductor wafer 2 in a first process step, the semiconductor wafer being used to produce the memory cells 6 with the stacked capacitors 12. The semiconductor wafer 2 comprises the substrate 4.

As FIG. 3A shows, the surface 8 of the substrate 4 has had the insulation layer 34 put on it, leaving free some of the contact plugs 26. By way of example, the insulation layer 34 may comprise silicon nitride. The contact plugs 26 are made from polycrystalline silicon, for example.

In a further step, a masking layer 40 is deposited on the surface 8 of the substrate 4, on the insulation layer 34 and on the contact plugs 26. The masking layer 40 is provided by means of full-area deposition of a silicon dioxide layer, for example.

In the next step, a respective trench 48 is formed in the masking layer 40 for all memory cells 6. By way of example, the trenches 48 may be formed using a plasma etching process. To this end, a hard mask is put on the top 42 of the masking layer 40 and is lithographically patterned in line with the situation of the trenches 48. The hard mask used may be a layer stack comprising a polysilicon 46 and a silicon nitride layer 47, for example.

Each of the trenches 48 is arranged above the associated contact plug 26 and extends from the top 42 of the masking layer 40 to the contact plugs 26 at the top surface 8 of the semiconductor wafer 2. Each of the trenches 48 has side walls 49, which may be perpendicular or slightly inclined, for example, as FIG. 3A shows.

Figure 3B:
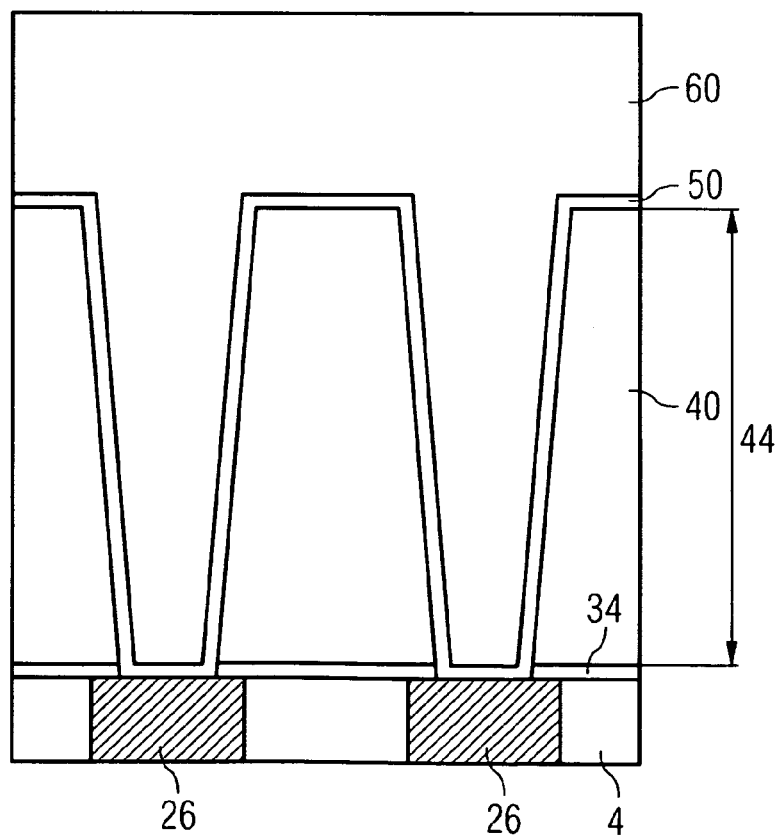

As FIG. 3B shows, the hard mask is removed again in a subsequent process step, and the conductive layer 50 is formed over the semiconductor wafer 2. The conductive layer 50 that is put on is an amorphous silicon layer, for example.

In a subsequent process step, a filling material 60 is put on the front 8 of the semiconductor wafer 2, for example by means of deposition of silicon dioxide from the vapor phase of tetraorthosilicate or TEOS (CVD method).

Next, the conductive layer 50 and the filling material 60 are removed from the top 42 of the masking layer 40 in a chemical-mechanical polishing step, as shown in FIG. 3C.

In a subsequent process step, which is shown in FIG. 3D, the conductive layer 50 in the upper region 63 that is remote from the contact plug 26 is removed from the top 42 of the masking layer 40 down to a depth 62, for example, using a dry etching process. The first electrode 28 is conserved as conductive layer 50, however, since the first electrode 28 is protected by the filling material 60 and the masking layer 40.

Figure 3E:
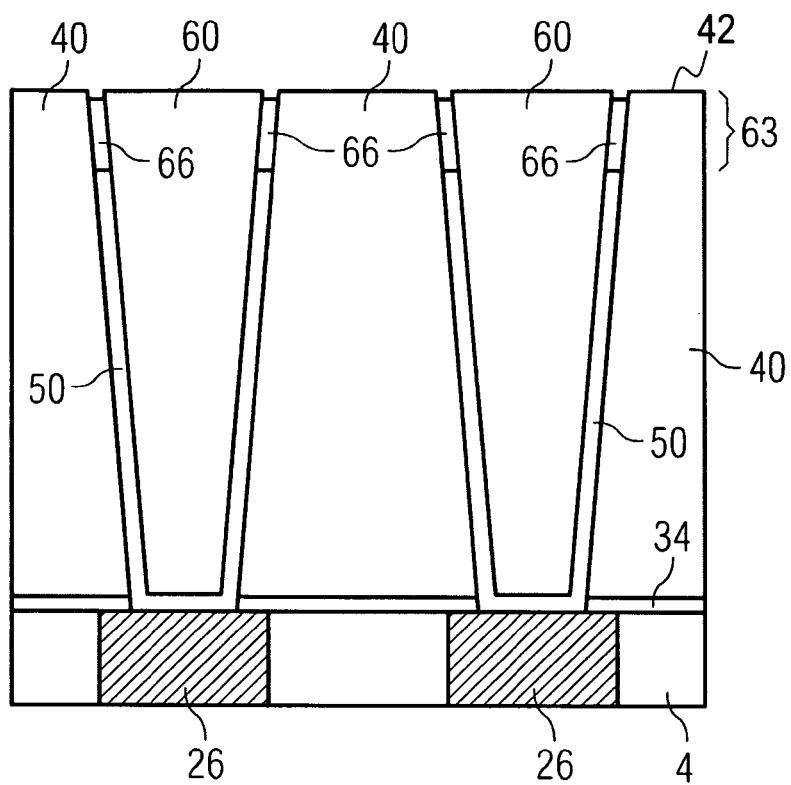

Next, as FIG. 3E shows, an insulating layer 66 instead of the conductive layer 50 is formed in the upper region 63. This can be done by depositing silicon nitride, for example, which is then back-etched by wet or dry chemical means or is planarized onto the masking layer 40 by means of chemical-mechanical polishing. The result is that the conductive layer 50 of the first electrode 28 in the upper region 63 is replaced by the insulating layer 66.

Figure 3F:
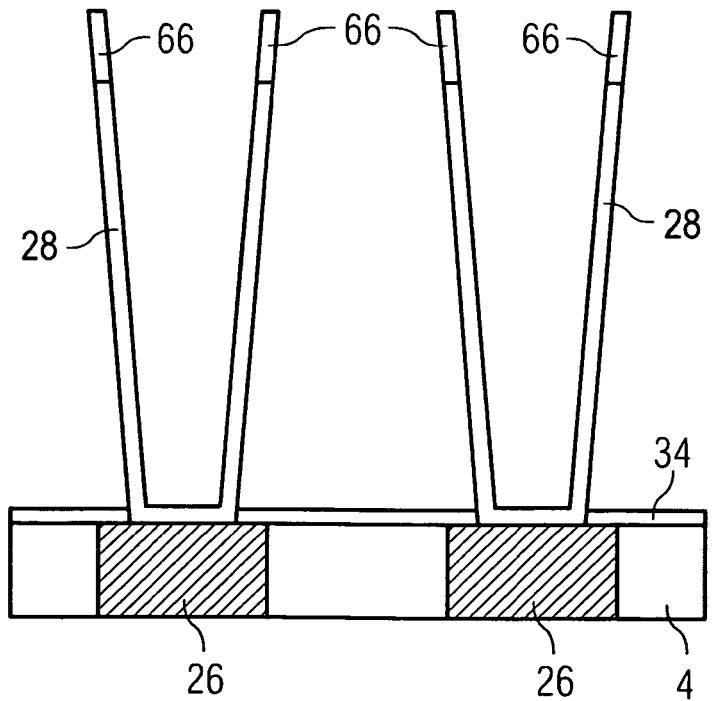

As FIG. 3F shows, the masking layer 40 and the filling material 60 are then removed in order to form the exposed first electrodes 28. The masking layer 40 and the filling material 60 are removed in one etching step, for example.

As already explained in connection with FIG. 1, the steps of putting on a dielectric layer that covers the side faces of the exposed first electrodes 28 and of depositing a further conductive layer over the dielectric layer on the front 8 of the semiconductor wafer 2, in order to form second electrodes 32 of the stacked capacitor 12, complete the process cycle for producing a stacked capacitor.

The result obtained is a stacked capacitor as shown in FIG. 3F, in which the first electrode 28 of the stacked capacitor 12 is supported on the contact plug 26 as a conductive layer 50. The first electrode has side walls that project from the front 8 of the substrate 4. That part of the first electrode that is remote from the substrate has an insulating layer that adjoins the conductive layer, that is to say, without covering it, continues in the direction of the side faces of the first electrode 28. In this context, "continuing" is understood to mean that the insulating layer adjoins the conductive layer directly and its side faces are arranged essentially parallel to the side faces of the conductive layer.

Figure 4A:
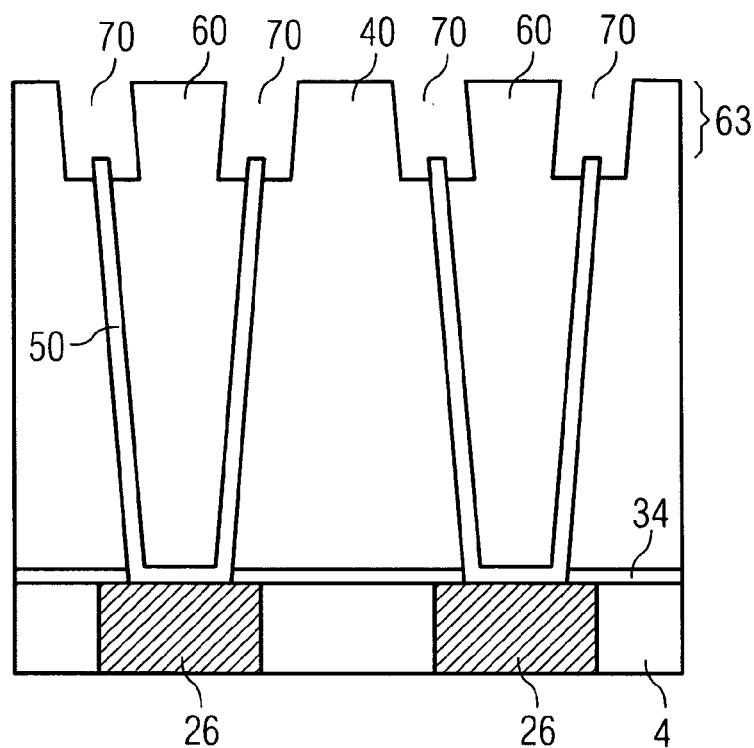
FIGS. 4A to 4C show another possible embodiment of an inventive method for forming the stacked capacitors, with cross-sectional views through a semiconductor wafer in various stages of the method being shown schematically in each case.

The text below describes another embodiment with reference to FIGS. 4A to 4C, with DRAM memory cells as shown in FIG. 1 again being produced.

The method based on this embodiment of the invention comprises, in the first steps, the process management that was described in connection with FIGS. 3A to 3D, which means that reference is also made to the description above where appropriate.

This embodiment of the invention, therefore, starts by forming cutouts, as has already been shown in FIG. 3D. This process step involves the conductive layer 50 in the upper region 63, which is remote from the contact plug 26 being removed from the top 42 of the masking layer 40 down to a depth 62, for example using a dry etching process, in order to form the cutouts 70.

Next, an isotropic etching step is performed for the masking layer 40 in order to widen the cutouts 70 in all directions. The result is cutouts 70 that are expanded in the lateral direction and in the direction of the substrate.

Figure 4B:
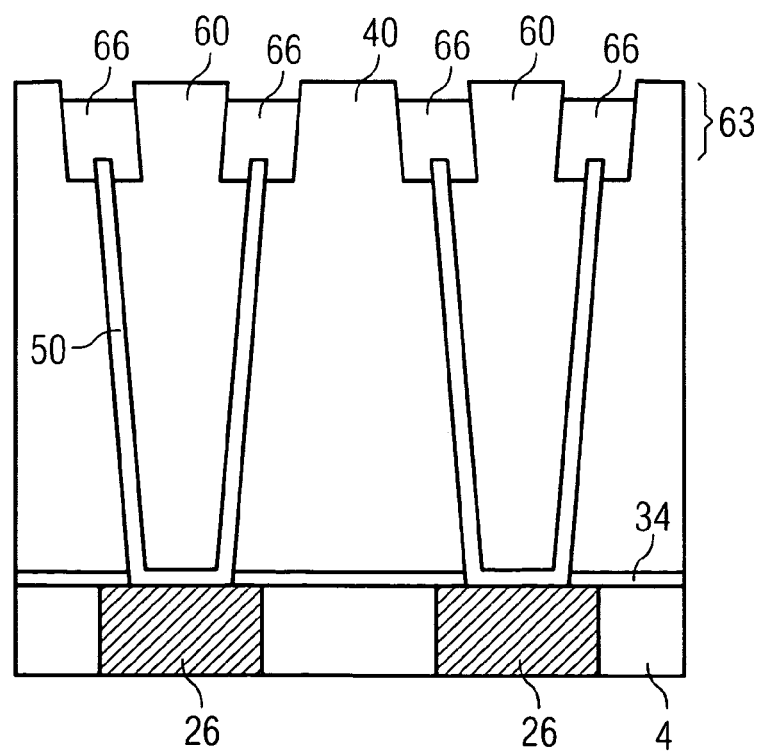

Next, as FIG. 4B shows, an insulating layer 66 is formed in the region of the cutouts, so that these are filled by the insulating material 66. This can be done by depositing silicon nitride, for example, which is then back-etched by wet or dry chemical means or is planarized onto the masking layer 40 by chemical-mechanical polishing.

Figure 4C:
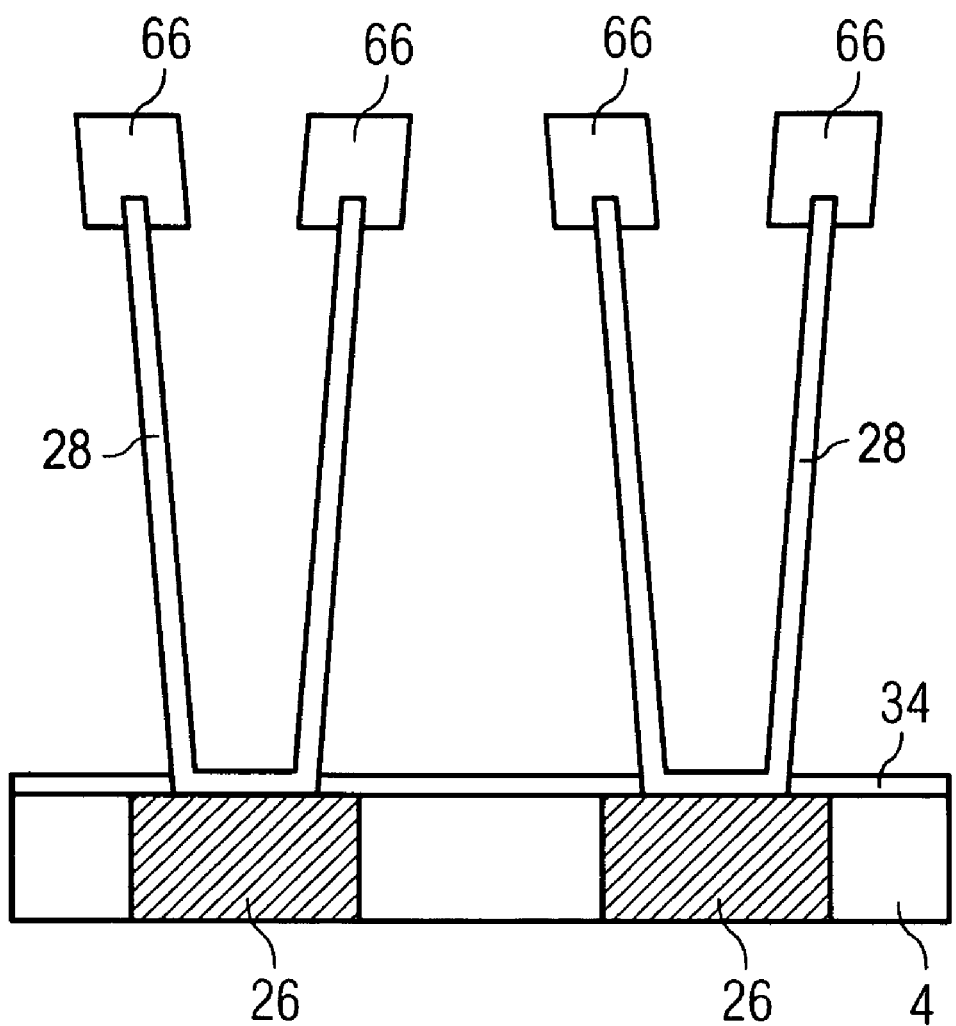

As FIG. 4C shows, the masking layer 40 and the filling material 60 are then removed in order to form the exposed first electrodes 28. By way of example, the masking layer 40 and the filling material 60 are removed in an etching step.

As already explained in connection with FIG. 1, the steps of putting on a dielectric layer that covers the side faces of the exposed first electrodes 28 and of depositing a further conductive layer over the dielectric layer on the front 8 of the semiconductor wafer 2, in order to form second electrodes 32 of the stacked capacitor 12, complete the process cycle for producing a stacked capacitor.

The result obtained is again a stacked capacitor as shown in FIG. 4C, in which the first electrode 28 of the stacked capacitor 12 (FIG. 1) is supported on the contact plug 26 as formed from conductive layer 50. The first electrode has side walls that project from the front 8 of the substrate 4. That part of the first electrode that is remote from the substrate has an insulating layer that adjoins the conductive layer and covers it at the top edge of the conductive layer. In addition, the insulating layer continues in the direction of the side faces of the first electrode 28.

The text below describes another embodiment with reference to FIGS. 5A to 5F, with DRAM memory cells as shown in FIG. 1 again being produced.

In a first process step, the method based on the third embodiment of the invention again provides the semiconductor wafer 2, which is used to produce the memory cells 6 with the stacked capacitors 12 (FIG. 1). The semiconductor wafer 2 comprises the substrate 4. In a further step, a masking layer 40 is deposited on the surface 8 of the substrate 4 and on the contact plugs 26.

In the next step, a respective trench 48 is formed in the masking layer 40 for all memory cells 6. Each of the trenches 48 is arranged above the associated contact plug 26 and extends from the top 42 of the masking layer 40 to the contact plugs 26 on the top 8 of the semiconductor wafer 2. Each of the trenches 48 has side walls 49 that may be perpendicular or slightly inclined, for example, as FIG. 5A shows.

As FIG. 5B shows, the conductive layer 50 is formed over the semiconductor wafer 2 in a subsequent process step.

In a subsequent process step, a dielectric layer 52 is formed over the semiconductor wafer 2, as FIG. 4C shows.

Figure 5C:
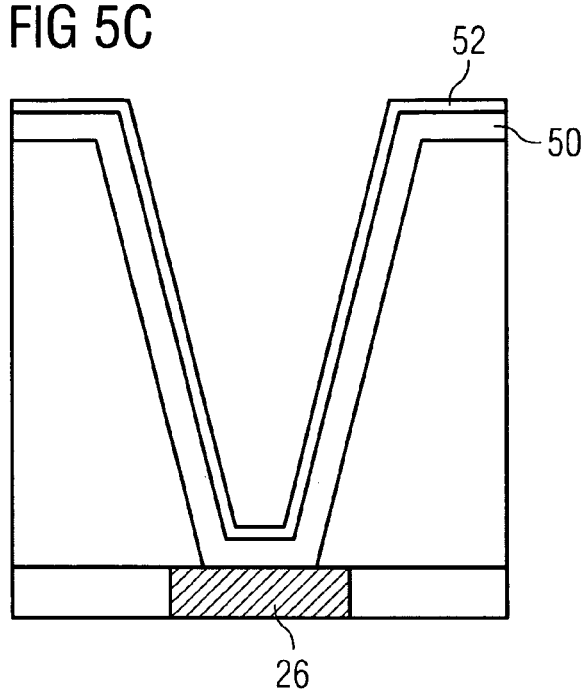
Figure 5D:
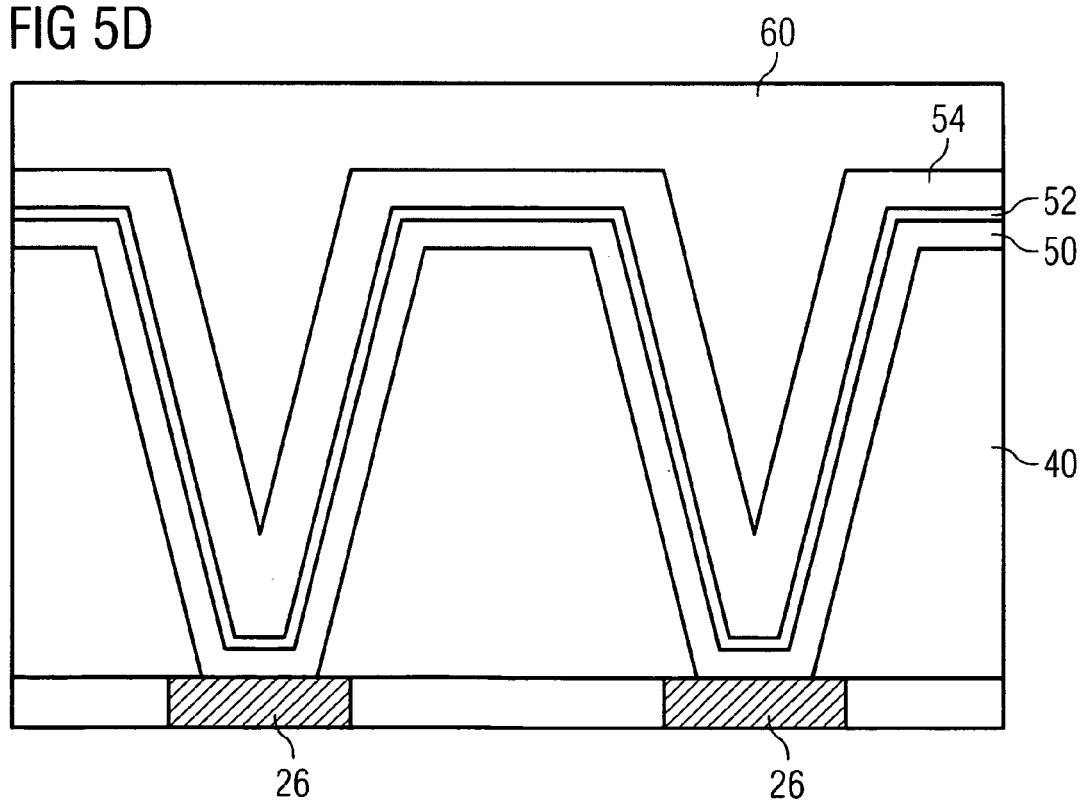

A second conductive layer 54 is then formed over the dielectric layer 52, as FIG. 5D shows. The trenches 48, which are now covered by the first conductive layer 50, by the dielectric layer 52 and by the second conductive layer 54, are then filled with a filling material 60.

In a subsequent process step, which is shown in FIG. 5E, a CMP step is carried out in order to remove the filling material 60, the first conductive layer 50, the dielectric layer 52 and the second conductive layer 54 from the top 42 of the masking layer 40.

Next, as FIG. 5F shows, the first conductive layer 50 and the second conductive layer 54 in the upper region 63, which is remote from the contact plug 26, are removed from the top 42 of the masking layer 40 down to a depth 62, for example using a dry etching process. However, the first electrode 28 is conserved as conductive layer 50, since the first electrode 28 is protected by the filling material 60 and the masking layer 40.

The subsequent process steps are similar to those that have already been explained in connection with the embodiments shown in FIGS. 2 and 3. The cutouts produced by removing the conductive layer are likewise filled with an insulating material. When the masking layer and the filling material have been removed, another embodiment allows a further dielectric layer to be deposited conformally over the substrate. This further dielectric layer can be partially removed, so that it remains essentially on the outer faces of the first conductive layer, that is to say is removed in the region of the formerly arranged filling material. A further conductive layer can then be deposited, which, together with the second conductive layer, forms the second electrode of the stacked capacitor.

In line with the invention, stacked capacitors are formed that have an insulating layer at their upper edge, so that it is not possible for a short circuit to arise in the event of any adhesion between adjacent electrodes. This allows an increase in yield and reliability of integrated semiconductor chips, which results in lower production costs.

What is claimed is:

1. A method for producing stacked capacitors for dynamic memory cells, the method comprising:
providing a semiconductor substrate;
forming a plurality of contact plugs at an upper surface of the substrate;
forming a masking layer on the upper surface of the substrate and over the contact plugs;
forming a plurality of trenches in the masking layer, each of the trenches being arranged above a respective contact plug, and each trench extending from a top surface of the masking layer to the contact plugs;
forming a conductive layer over the semiconductor substrate, the conductive layer covering side walls of the trenches and the contact plugs in order to form a first electrode of the stacked capacitor;
forming a filling material over the semiconductor substrate such that the trenches are filled with the filling material up to the top of the masking layer;
replacing an upper portion of the conductive layer of the first electrode with an insulating material by reacting the upper portion of the conductive layer such that the upper portion is converted to the insulating material, the upper portion being remote from the contact plugs;
removing the masking layer and the filling material thereby exposing side faces of the first electrodes;
forming a dielectric layer that overlies the exposed side faces of the first electrodes; and
forming a further conductive layer above the dielectric layer in order to form second electrodes of the stacked capacitors.

2. The method as claimed in claim 1, wherein forming a conductive layer comprises forming a metal layer.

3. The method as claimed in claim 2, wherein replacing the upper portion of the conductive layer of the first electrode comprises:
removing the masking layer and the filling material in the upper region that is remote from the contact plugs; and
oxidizing the metal layer to form the insulating material.

4. The method as claimed in claim 3, wherein the metal layer comprises titanium nitride and the step of oxidizing the metal layer forms titanium oxide, the titanium oxide having a volume expansion of about 5% to about 50% in comparison with the titanium nitride before oxidization.

5. The method as claimed in claim 4, wherein oxidizing the metal layer is carried out at approximately 500° C. to 600° C.

6. The method as claimed in claim 3, wherein removing the masking layer and the filling material in the upper region is carried out using a dry etching process.

7. The method as claimed in claim 1, wherein forming a conductive layer and forming the filling material comprise:
conformally depositing the conductive layer;
conformally depositing the filling material; and
chemical-mechanical polishing the upper surface of the semiconductor substrate in order to remove the conductive layer and the filling material from over the masking layer.

8. The method as claimed in claim 1, wherein removing the masking layer and the filling material takes place in an etching step.

9. The method as claimed in claim 1, wherein forming the conductive layer and forming the filling material comprise:
conformally depositing the conductive layer;
conformally depositing the filling material;
chemical-mechanical polishing the upper surface of the semiconductor substrate in order to remove the conductive layer and the filling material from over the masking layer; and
removing portions of the conductive layer exposed on the top of the masking layer by etching.

10. A method for producing stacked capacitors for dynamic memory cells, the method comprising:
providing a semiconductor substrate;
forming a plurality of contact plugs on an upper surface of the substrate;
forming a masking layer over the upper surface of the substrate and over the contact plugs;
forming a plurality of trenches in the masking layer, each of the trenches being arranged above a respective contact plug, and each trench extending from a top surface of the masking layer to the contact plugs;
forming a first conductive layer over the upper surface of the semiconductor substrate;
forming a dielectric layer over the first conductive layer;
forming a second conductive layer over the dielectric layer;
removing the first conductive layer, the dielectric layer and the second conductive layer from the top of the masking layer;
forming a filling material over the semiconductor substrate such that the trenches are at least substantially filled with the filling material;
forming cutouts by removing the first conductive layer and the second conductive layer in an upper region that is remote from the contact plugs;
forming an insulating layer in the upper region thus filling the cutouts;
removing the filling material;
forming a further dielectric layer that covers outer faces of the first conductive layer; and
forming a further conductive layer over the semiconductor substrate in order to form a second electrode of the stacked capacitor.

11. The method as claimed in claim 10, wherein forming the first conductive layer comprises forming a doped amorphous silicon layer.

12. The method as claimed in claim 10, wherein forming the masking layer comprises depositing a silicon dioxide layer.

13. The method as claimed in claim 12, wherein forming the filling material comprises depositing a further silicon dioxide layer.

14. The method as claimed in claim 10, wherein forming the filling material comprises:
conformally depositing the filling material; and
chemical-mechanical polishing the semiconductor substrate in order to remove the filling material from over the masking layer.

15. The method as claimed in claim 10, wherein removing the first conductive layer, the dielectric layer and the second conductive layer from the top of the masking layer is carried out by means of chemical-mechanical polishing the semiconductor substrate.

16. The method as claimed in claim 10, wherein removing the first conductive layer and the second conductive layer comprises removing doped amorphous silicon using a dry etching process.

17. A stacked capacitor for a dynamic memory cell, the stacked capacitor comprising:
a contact plug over a top surface of a substrate;
a cup-shaped first electrode supported over the contact plug, the first electrode formed from a conductive layer and having side surfaces that project from the top surface of the substrate, wherein a portion of the first electrode that is remote from the substrate has an insulating layer that adjoins the conductive layer, side faces of the insulating layer continuing in a direction of the side faces of the first electrode, wherein the insulating layer of the first electrode comprises an oxide of the conductive layer and wherein the conductive layer comprises a metal layer;
a dielectric layer covering at least the side faces of the first electrodes; and
a further conductive layer covering the dielectric layer, the further conductive layer forming a second electrode of the stacked capacitor.

18. The stacked capacitor as claimed in claim 17, wherein the insulating layer of the first electrode has a greater thickness than the conductive layer.

19. A method for producing stacked capacitors for dynamic memory cells, the method comprising:
providing a semiconductor substrate;
forming a plurality of contact plugs at an upper surface of the substrate;
forming a semiconductor layer on the upper surface of the substrate and over the contact plugs, the semiconductor layer forming a masking layer;
forming a plurality of trenches in the masking layer, each of the trenches being arranged above a respective contact plug, and each trench extending from a top surface of the masking layer to the contact plugs;
forming a conductive layer over the semiconductor substrate, the conductive layer covering side walls of the trenches and the contact plugs in order to form a first electrode of the stacked capacitor;
forming a filling material over the semiconductor substrate such that the trenches are filled with the filling material up to the top of the masking layer;
replacing an upper portion of the conductive layer of the first electrode with an insulating material, the upper portion being remote from the contact plugs;
removing the masking layer and the filling material thereby exposing side faces of the first electrodes;
forming a dielectric layer that overlies the exposed side faces of the first electrodes; and
forming a further conductive layer above the dielectric layer in order to form second electrodes of the stacked capacitors.

20. The method as claimed in claim 19, wherein forming a semiconductor layer comprises depositing a polycrystalline silicon/germanium layer.

21. The method as claimed in claim 19, wherein forming a semiconductor layer comprises depositing a polycrystalline silicon layer.

22. The method as claimed in claim 21, wherein forming a filling material comprises depositing a further polycrystalline silicon layer.

23. The method as claimed in claim 19, wherein replacing the upper portion of the conductive layer of the first electrode comprises:
- removing the conductive layer in the upper region that is remote from the contact plugs in order to form cutouts;
- depositing an insulating layer to fill the cutouts with the insulating material; and
- removing portions of the insulating layer that are situated on the filling material and on the masking layer.

24. The method as claimed in claim 23, wherein depositing the insulating layer comprises depositing silicon nitride.

25. The method as claimed in claim 23, wherein removing the conductive layer in the upper region that is remote from the contact plugs in order to form cutouts is followed by performance of isotropic etching of the filling material and of the masking layer in order to expand the cutouts laterally and in the direction of the substrate.

26. The method as claimed in claim 19, wherein the conductive layer comprises titanium nitride, wherein the insulating material has a first length and wherein the insulating material has a volume that is about 5% to about 50% greater than a volume of a first length of the conductive layer.

27. The method as claimed in claim 26, wherein the insulating material comprises silicon nitride.

* * * * *